United States Patent
Nakazono et al.

(10) Patent No.: US 11,834,586 B2
(45) Date of Patent: Dec. 5, 2023

(54) CONDUCTIVE PAINT, METHOD FOR PRODUCING SHIELD PACKAGE USING THE SAME, AND METHOD FOR PRODUCING RESIN MOLDED ARTICLE HAVING SHIELD LAYER

(71) Applicant: TATSUTA ELECTRIC WIRE & CABLE CO., LTD., Higashiosaka (JP)

(72) Inventors: Hajime Nakazono, Kizugawa (JP); Masamichi Nisogi, Kizugawa (JP)

(73) Assignee: TATSUTA ELECTRIC WIRE & CABLE CO., LTD., Higashiosaka (JP)

( * ) Notice: Subject to any disclaimer, the term of this patent is extended or adjusted under 35 U.S.C. 154(b) by 55 days.

(21) Appl. No.: 17/627,250

(22) PCT Filed: Jul. 7, 2020

(86) PCT No.: PCT/JP2020/026574
§ 371 (c)(1),
(2) Date: Jan. 14, 2022

(87) PCT Pub. No.: WO2021/014964
PCT Pub. Date: Jan. 28, 2021

(65) Prior Publication Data
US 2022/0251398 A1    Aug. 11, 2022

(30) Foreign Application Priority Data

Jul. 25, 2019    (JP) .................................. 2019-137171

(51) Int. Cl.
*C09D 5/24*    (2006.01)
*C09D 7/61*    (2018.01)
(Continued)

(52) U.S. Cl.
CPC .................. *C09D 5/24* (2013.01); *C09D 7/61* (2018.01); *C09D 7/63* (2018.01); *C09D 163/00* (2013.01); *H01B 1/22* (2013.01); *H01L 21/56* (2013.01); *H01L 23/29* (2013.01); *H01L 23/31* (2013.01)

(58) Field of Classification Search
CPC .... C08G 59/4028; C08K 3/08; C08K 5/0025; C08L 63/00; H01B 1/22; C09D 163/00;
(Continued)

(56) References Cited

U.S. PATENT DOCUMENTS

2014/0326929 A1    11/2014  Hsueh et al.
2017/0247550 A1    8/2017   Umeda et al.
(Continued)

FOREIGN PATENT DOCUMENTS

JP    2011-71057 A    4/2011
JP    2011-100573 A   5/2011
(Continued)

OTHER PUBLICATIONS

International Search Report dated Sep. 24, 2020, issued in counterpart International Application No. PCT/JP2020/026574 (3 pages).
(Continued)

*Primary Examiner* — Mark Kopec
*Assistant Examiner* — Jaison P Thomas
(74) *Attorney, Agent, or Firm* — WHDA, LLP

(57) ABSTRACT

Provided is a conductive paint that can be cured at a temperature of 110° C. or less and has both excellent conductivity and adhesiveness. The conductive paint includes, per 100 parts by mass of a binder component (A) containing an epoxy resin, 1,000 to 4,000 parts by mass of metal particles (B), 50 to 150 parts by mass of a blocked isocyanate curing agent (C), and 200 to 1,500 parts by mass of a solvent (D).

20 Claims, 2 Drawing Sheets

(51) Int. Cl.
　　*C09D 7/63*　　　(2018.01)
　　*C09D 163/00*　　(2006.01)
　　*H01B 1/22*　　　(2006.01)
　　*H01L 21/56*　　 (2006.01)
　　*H01L 23/29*　　 (2006.01)
　　*H01L 23/31*　　 (2006.01)

(58) Field of Classification Search
　　CPC ... C09D 5/24; C09D 7/20; C09D 7/61; C09D 7/62; C09D 7/63; H01L 21/56; H01L 21/561; H01L 23/29; H01L 23/31; H01L 23/3121; H01L 23/552
　　See application file for complete search history.

(56) References Cited

U.S. PATENT DOCUMENTS

| | | |
|---|---|---|
| 2019/0292381 A1 | 9/2019 | Nakazono et al. |
| 2020/0299523 A1 | 9/2020 | Umeda et al. |

FOREIGN PATENT DOCUMENTS

| | | | |
|---|---|---|---|
| JP | 2011-238596 A | 11/2011 | |
| JP | 2013-196953 A | 9/2013 | |
| JP | 2014-220238 A | 11/2014 | |
| JP | 2017-179360 A | 10/2017 | |
| JP | 2017-179362 A | 10/2017 | |
| WO | 2016/051700 A1 | 4/2016 | |
| WO | 2017/170398 A1 | 10/2017 | |
| WO | WO-2017170398 A1 * | 10/2017 | ............ C08F 283/10 |
| WO | 2018/012017 A1 | 1/2018 | |

OTHER PUBLICATIONS

International Preliminary Report on Patentability (Form PCT/IPEA/409) dated May 7, 2021, issued in counterpart International Application No. PCT/JP2020/026574, w/English translation (16 pages).
Office Action dated May 23, 2023, issued in counterpart JP Application No. 2021-533921, with English Translation. (10 pages).

* cited by examiner

[FIG.1(a)]
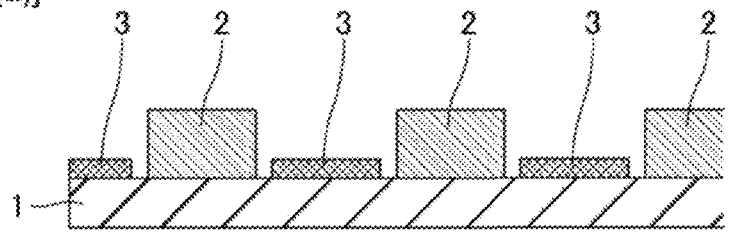
[FIG.1(b)]
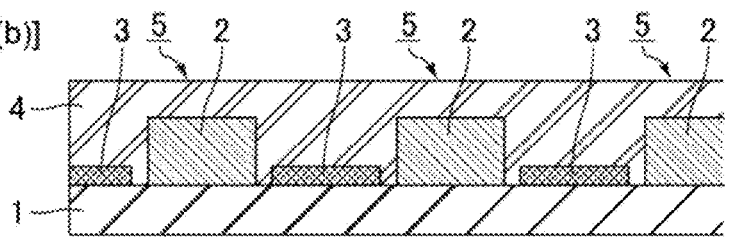
[FIG.2]
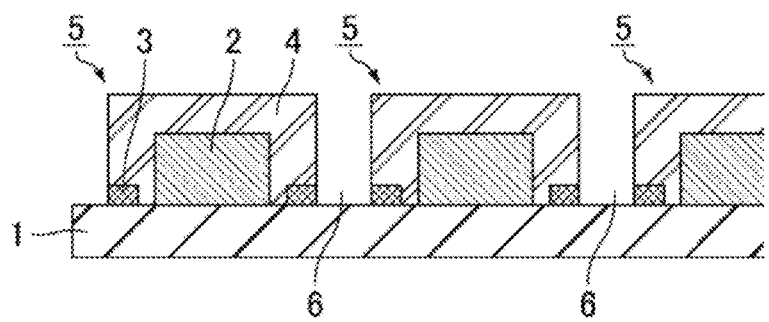
[FIG.3]
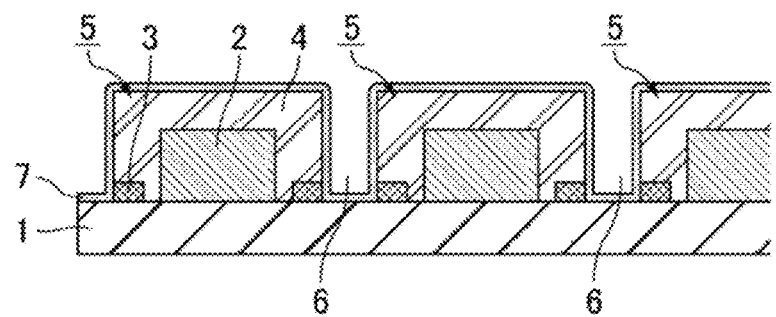
[FIG.4]
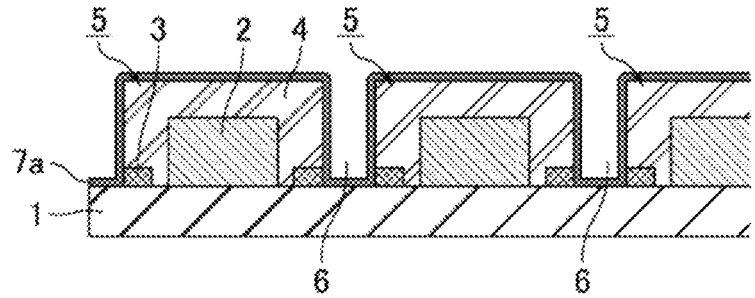

[FIG.5]
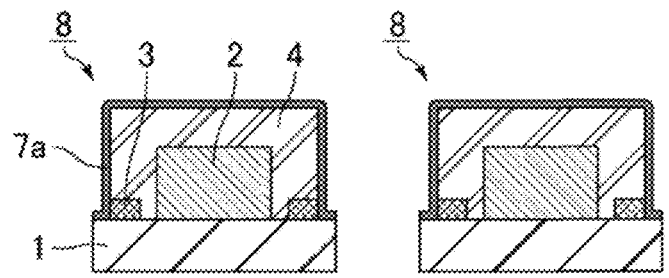
[FIG.6(a)]
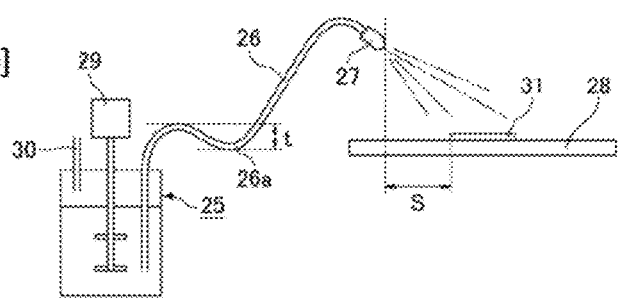
[FIG.6(b)]
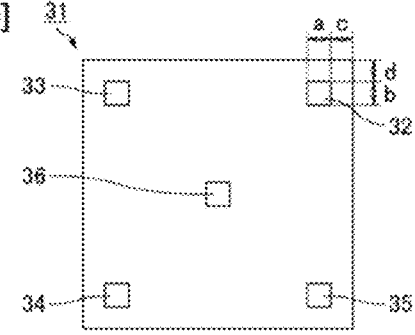
[FIG.6(c)]
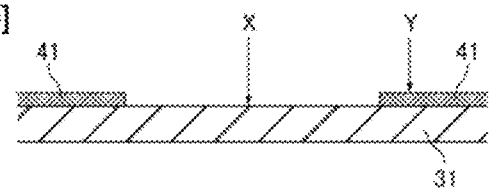

CONDUCTIVE PAINT, METHOD FOR PRODUCING SHIELD PACKAGE USING THE SAME, AND METHOD FOR PRODUCING RESIN MOLDED ARTICLE HAVING SHIELD LAYER

TECHNICAL FIELD

The present invention relates to a conductive paint, a method for producing a shield package using the same, and method for producing a resin molded article having a shield layer.

BACKGROUND ART

In recent years, electronic devices such as mobile phones and tablet terminals have mounted thereon a large number of electronic components for wireless communications to allow for large-volume data transmission. Such electronic components for wireless communications are prone to generate noise. In addition, their susceptibility to noise is high, causing a problem in that they are prone to malfunction when exposed to external noise.

In addition, in order to achieve electronic devices having reduced size and weight together with higher performance, an increase in the mounting density of electronic components has been demanded. However, an increase in the mounting density results in an increase in the number of electronic components that serve as the sources of noise, causing a problem in that the number of electronic components affected by noise also increases.

Conventionally, a so-called shield package configured such that an electronic component, which is the source of noise, together with its package are covered with a shield layer to prevent noise generation by the electronic component and also prevent the intrusion of noise has been known.

As a conductive paint for forming such a shield layer, PTL 1 describes a conductive paint containing at least, per 100 parts by mass of a binder component (A) containing a solid epoxy resin that is solid at ordinary temperatures and a liquid epoxy resin that is liquid at ordinary temperatures, 500 to 1,800 parts by mass of metal particles (B) having a tap density of 5.3 to 6.5 g/cm$^3$, 0.3 to 40 parts by mass of a curing agent (C) containing at least one imidazole-based curing agent, and 150 to 600 parts by mass of a solvent (D). In addition, PTL 2 describes a conductive paint containing at least, per 100 parts by mass of a binder component (A) containing an epoxy resin, 200 to 1,800 parts by mass of metal particles (B), 0.3 to 40 parts by mass of a curing agent (C), 20 to 600 parts by mass of a solvent (D), and 0.5 to 10 parts by mass of a carbon powder (E).

However, in the case where such a conductive paint is used, because the curing temperature is relatively high, there has been a risk of damaging the electronic component in the shield package.

In addition, it has been demanded to provide a resin molded article with a shield layer. Specifically, in order to achieve weight reduction of automobiles, replacement of the conventionally used metal parts with engineering plastics has been considered, and it has been demanded to impart shielding characteristics to resin molded articles made of such engineering plastics.

Known methods for forming a shield layer on the surface of a resin molded article include a method in which a conductive sheet, a metal foil, or a metal mesh is attached, and also a method for forming a shield layer using an electroless plating method, in which a resin molded article is immersed in a plating solution to form a metal film.

However, some shield layers obtained by these methods do not offer sufficient shielding characteristics or adhesion. In addition, there also are problems in that depending on the shape of the resin molded article, it is not possible to attach a conductive sheet, a metal foil, or the like, or that in the electroless plating method, because a resin molded article is immersed in a plating solution, a shield layer cannot be formed in some areas.

CITATION LIST

Patent Literature

PTL 1: JP-A-2017-179362
PTL 2: JP-A-2017-179360

SUMMARY OF INVENTION

Technical Problem

Against such problems, it may also be possible to apply a conductive paint to the surface of a resin molded article and cure the same to form a shield layer. However, conventional conductive paints have relatively high curing temperatures, and thus have been inapplicable to a resin molded article having a heatproof temperature of 110° C. or less.

The invention has been made to solve the above problems, and an object of the invention is to provide a conductive paint that can be cured at a temperature of 110° C. or less and has both excellent conductivity and adhesiveness.

Solution to Problem

That is, the conductive paint of the invention includes, per 100 parts by mass of a binder component (A) containing an epoxy resin, 1,000 to 4,000 parts by mass of metal particles (B), 50 to 150 parts by mass of a blocked isocyanate curing agent (C), and 200 to 1,500 parts by mass of a solvent (D).

It is possible that the metal particles (B) are at least one kind selected from the group consisting of a silver powder, a silver-coated copper powder, and a silver-coated copper alloy powder.

It is possible that the conductive paint is used for a shield package.

The method for producing a shield package of the invention is a method for producing a shield package including a package covered with a shield layer, the package including an electronic component mounted on a substrate and encapsulated with an encapsulant, the method including: a package formation step of mounting a plurality of electronic components on a substrate, and loading an encapsulant onto the substrate followed by curing to encapsulate the electronic components, thereby preparing packages; a conductive paint application step of applying the conductive paint described above onto the substrate having formed thereon the packages; a shield layer formation step of heating the substrate having applied thereto the conductive paint to cure the conductive paint, thereby forming a shield layer; and a cutting step of cutting the substrate to singulate the packages.

It is possible that the method for producing a shield package of the invention is a method for producing a shield package including a package covered with a shield layer, the package including an electronic component mounted on a substrate and encapsulated with an encapsulant, the method including: a package formation step of mounting a plurality of electronic components on a substrate, and loading an encapsulant onto the substrate followed by curing to encapsulate the electronic components, thereby preparing packages; a package individualization step of, after the package formation step, cutting the encapsulant between the plurality of electronic components to form grooves, thereby individualizing the packages on the substrate by the grooves; a conductive paint application step of applying the conductive paint described above onto the substrate having formed thereon the packages; a shield layer formation step of heating the substrate having applied thereto the conductive paint to cure the conductive paint, thereby forming a shield layer; and a cutting step of cutting the substrate along the grooves to singulate the packages.

It is possible that the heating in the shield layer formation step is performed at a temperature of 90 to 110° C.

The method for producing a resin molded article having a shield layer of the invention includes a conductive paint application step of applying the conductive paint described above to a resin molded article, and a shield layer formation step of heating the resin molded article having applied thereto the paint at a temperature of 90 to 110° C. to cure the paint, thereby forming a shield layer.

Advantageous Effects of Invention

According to the invention, a conductive paint that can be cured at a temperature of 110° C. or less and has both excellent conductivity and adhesiveness can be obtained.

BRIEF DESCRIPTION OF DRAWINGS

FIGS. 1(a) and 1(b) are schematic diagrams showing an example of the package formation step of the method for producing a shield package of the invention.

FIG. 2 is a schematic diagram showing an example of the package individualization step of the method for producing a shield package of the invention.

FIG. 3 is a schematic diagram showing an example of the conductive paint application step of the method for producing a shield package of the invention.

FIG. 4 is a schematic diagram showing an example of the shield layer formation step of the method for producing a shield package of the invention.

FIG. 5 is a schematic diagram showing an example of the cutting step of the method for producing a shield package of the invention.

FIGS. 6(a) to 6(c) are schematic diagrams showing a method for evaluating application stability.

DESCRIPTION OF EMBODIMENTS

Hereinafter, the conductive paint of the invention will be described in detail. However, the invention is not limited to the following embodiments, and can be applied with suitable modifications to the extent that the gist of the invention is not changed.

The conductive paint of the invention includes, per 100 parts by mass of a binder component (A) containing an epoxy resin, 1,500 to 4,000 parts by mass of metal particles (B), 50 to 150 parts by mass of a blocked isocyanate curing agent (C), and 200 to 1,500 parts by mass of a solvent (D).

The binder component (A) contained in the conductive paint of the invention contains an epoxy resin as an essential component. The proportion of the epoxy resin in the binder component (A) is preferably 5 to 100 mass %, and more preferably 30 to 100 mass %.

In addition, it is preferable that the epoxy resin contains both an epoxy resin that is solid at ordinary temperatures and an epoxy resin that is liquid at ordinary temperatures. In this case, the proportion of the epoxy resin that is solid at ordinary temperatures in the binder component (A) is preferably 5 to 80 mass %, and more preferably 20 to 60 mass. The proportion of the epoxy resin that is liquid at ordinary temperatures in the binder component (A) is preferably 20 to 95 mass, and more preferably 40 to 80 mass.

Incidentally, as used herein, "solid at ordinary temperatures" means that it has no fluidity at 25° C. under solvent-free conditions, and "liquid at ordinary temperatures" means that it has fluidity at 25° C. under solvent-free conditions.

As a result of using an epoxy resin that is solid at ordinary temperatures, a conductive paint that can be uniformly applied to the package surface to form an even shield layer is likely to be obtained. As the epoxy resin that is solid at ordinary temperatures, one having two or more glycidyl groups in the molecule and having an epoxy equivalent of 150 to 280 g/eq is preferable. When the epoxy equivalent is 150 g/eq or more, problems such as cracking and warping are less likely to occur, while when it is 280 g/eq or less, a cured product having even better heat resistance is likely to be obtained.

In addition, the epoxy resin that is solid at ordinary temperatures is not particularly limited. For example, bisphenol type epoxy resins such as bisphenol A type epoxy resin, bisphenol F type epoxy resin, and bisphenol S type epoxy resin, spirocyclic epoxy resins, naphthalene type epoxy resins, biphenyl type epoxy resins, terpene type epoxy resins, glycidyl ether type epoxy resins such as tris(glycidyloxyphenyl)methane and tetrakis(glycidyloxyphenyl)ethane, glycidyl amine type epoxy resins such as tetraglycidyl-diaminodiphenylmethane, tetrabromobisphenol A type epoxy resins, novolac type epoxy resins such as cresol novolac type epoxy resin, phenol novolac type epoxy resin, α-naphthol novolac type epoxy resin, and brominated phenol novolac type epoxy resin, rubber modified epoxy resins, and the like can be used. They may be used alone, and it is also possible to use two or more kinds together. In addition, the epoxy resin that is solid at ordinary temperatures may be dissolved in the below-described solvent (D) before use.

In the case where the epoxy resin contains an epoxy resin that is liquid at ordinary temperatures, it is preferable that the epoxy resin that is liquid at ordinary temperatures contains both a liquid glycidyl amine-based epoxy resin and a liquid glycidyl ether-based epoxy resin. In this case, the proportion of the liquid glycidyl amine-based epoxy resin in the binder component (A) is preferably 5 to 40 mass %, and the proportion of the liquid glycidyl ether-based epoxy resin in the binder component (A) is preferably 15 to 55 mass %.

In the binder component (A), in the case where a liquid glycidyl amine-based epoxy resin and a liquid glycidyl ether-based epoxy resin are contained in the above proportions, the conductivity and adhesion of the conductive paint are well balanced and excellent. Further, warping of the cured product after curing is further reduced, and a shield package having even better heat resistance is likely to be obtained.

The liquid glycidyl amine-based epoxy resin preferably has an epoxy equivalent of 80 to 120 g/eq. In addition, the viscosity of the liquid glycidyl amine-based epoxy resin is preferably 1.5 Pa·s or less, and more preferably 0.5 to 1.5 Pa·s.

The liquid glycidyl ether-based epoxy resin preferably has an epoxy equivalent of 180 to 220 g/eq. In addition, the viscosity of the liquid glycidyl ether-based epoxy resin is preferably 6 Pa·s or less, and more preferably 1 to 6 Pa·s.

When the binder component (A) contains a liquid glycidyl amine-based epoxy resin and a liquid glycidyl ether-based epoxy resin each having the above epoxy equivalent and the above viscosity, warping of the cured product after curing is further reduced, and a shield package having even better heat resistance, in which the cured product is even more uniform in thickness, is likely to be obtained.

As used herein, the viscosities of the liquid glycidyl amine-based epoxy resin and the liquid glycidyl ether-based epoxy resin mean values measured with a BH-type viscometer (rotor No. 5, rotation speed: 10 rpm) at a liquid temperature of 25° C.

The binder component (A) may further contain, for the purpose of improving the physical properties of the conductive paint, a modifier such as an alkyd resin, a melamine resin, or a xylene resin.

In the case where a modifier is contained, the content ratio thereof in the binder component (A) is preferably 40 mass % or less, and more preferably 10 mass % or less.

The metal particles (B) contained in the conductive paint of the invention are not particularly limited as long as they are particles having conductivity, and may be, for example, a copper powder, a silver powder, a nickel powder, a silver-coated copper powder, a gold-coated copper powder, a silver-coated nickel powder, a gold-coated nickel powder, a silver-coated copper alloy powder, or the like. Among them, it is preferable that the metal particles are at least one kind selected from the group consisting of a silver powder, a silver-coated copper powder, and a silver-coated copper alloy powder.

These metal particles have high conductivity. Thus, when the conductive paint of the invention is cured to make a shield layer, the shield layer has sufficient conductivity.

The shape of the metal particles is not particularly limited. They may be spherical, flaky (scaly), dendritic, or fibrous, and preferably spherical or flaky (scaly). Incidentally, "spherical" metal particles include not only substantially true spherical particles (atomized powder) but also substantially spherical particles, such as substantially polygonal spheres (reduced powder) and amorphous particles (electrolytic powder).

The metal particles (B) in one embodiment may contain spherical metal particles and flaky metal particles, and the content ratio in such a case (spherical:flaky) is, on mass basis, preferably 10:90 to 80:20, and more preferably 20:80 to 60:40.

In the case where the shape of the metal particles is flaky, the tap density thereof is preferably 4.0 to 6.0 g/cm$^3$. When the tap density is within the above range, the shield layer formed by curing the conductive paint has excellent conductivity.

In addition, in the case where the shape of metal particles is flaky, the aspect ratio thereof is preferably 5 to 20, and more preferably 5 to 10. When the aspect ratio is within the above range, the shield layer formed by curing the conductive paint has even better conductivity.

The average particle size of the metal particles is preferably 1 to 30 μm. When the average particle size of the metal particles is 1 μm or more, such metal particles have excellent dispersibility and thus can be prevented from aggregation. In addition, the metal particles are less likely to be oxidized. In the case where the average particle size of the metal particles is 30 μm or less, when the conductive paint of the invention is cured to make a shield layer, the connectivity to the package's ground circuit is excellent.

As used herein, "average particle size of metal particles" means the number-based average particle size D50 (median size) measured by the laser diffraction/scattering method.

The content of the metal particles (B) is, per 100 parts by mass of the binder component (A), 1,000 to 4,000 parts by mass, preferably 1,500 to 3,500 parts by mass, and more preferably 2,000 to 3,300 parts by mass.

In the case where the content of the metal particles (B) is 1,000 parts by mass or more per 100 parts by mass of the binder component (A), when the conductive paint is cured to make a shield layer, the conductivity of the shield layer is likely to be excellent. In addition, in the case where the content of the metal particles (B) is 4,000 parts by mass or less per 100 parts by mass of the binder component (A), when the conductive paint is cured to make a shield layer, the adhesion to packages and the application stability are likely to be excellent, and, upon cutting the shield layer with a dicing saw or the like, chipping is less likely to occur.

The blocked isocyanate curing agent (C) used in the invention is an isocyanate curing agent in which the isocyanate group is protected with a protecting group. As the protecting group, one that is removed at a temperature of 90 to 110° C. is preferable. For example, secondary or tertiary alcohols, CH-acid compounds, oximes, lactams, phenols, N-alkylamides, imides, secondary amines, and the like can be mentioned. Specifically, secondary or tertiary alcohols such as isopropanol and t-butanol, CH-acid compounds such as diethyl malonate, acetylacetone, and ethyl acetoacetate, oximes such as formaldoxime, acetaldoxime, butanoxime, cyclohexanone oxime, acetophenone oxime, benzophenone oxime, and diethylene glyoxime, lactams such as caprolactam, valerolactam, and butyrolactam, phenols such as phenol and o-methylphenol, N-alkylamides such as N-methylacetamide, imides such as phthalimide, and secondary amines such as diisopropylamine, imidazole, 2-isopropylimidazole, pyrazole, 3,5-dimethylpyrazole, 1,2,4-triazole, and 2,5-dimethyl-1,2,4-triazole can be used. As the blocked isocyanate curing agent, a commercially available product may also be used. For example, those available under the trade names "Coronate 2554" and "Coronate BI-301" manufactured by Tosoh Corporation, the trade names "Meikanate CX" and "SU-268A" manufactured by Meisei Chemical Works, Ltd., the trade name "Karenz MOI-BM" manufactured by Showa Denko Corporation, and the like can be mentioned. As a result of using the blocked isocyanate curing agent as a curing agent, a conductive paint excellent in low-temperature curability, conductivity, and storage stability can be obtained.

The content of the blocked isocyanate curing agent (C) is 50 to 150 parts by mass per 100 parts by mass of the binder component (A). In the case where the content is 50 parts by mass or more, when a shield layer is formed using the conductive paint of the invention, the adhesion between the shield layer and the package surface and also the curability are excellent, and further the conductivity of the shield layer is likely to be excellent. As a result, a shield layer having an excellent shielding effect is likely to be obtained. When the content is 150 parts by mass or less, the storage stability of the conductive paint is improved. In addition, the conductivity of the shield layer is likely to be excellent.

In addition, to the extent that the advantages of the invention are not impaired, other curing agents may also be contained in addition to the blocked isocyanate curing agent. For example, isocyanate curing agents, phenol curing agents, imidazole curing agents, amine curing agents, cation curing agents, radical curing agents, and the like can be mentioned.

The content of the solvent (D) is 200 to 1,500 parts by mass per 100 parts by mass of the binder component (A). When the content is within the above range, the viscosity of the conductive paint can be easily adjusted within the below-described preferred range.

The solvent (D) is not particularly limited. For example, methyl ethyl ketone, acetone, acetophenone, methyl cellosolve, methyl cellosolve acetate, methyl carbitol, diethylene glycol dimethyl ether, tetrahydrofuran, methyl acetate, 1-methoxy-2-propanol, 3-methoxy-3-methyl-1-butyl acetate, and the like can be used. They may be used alone, and it is also possible to use two or more kinds together.

In the conductive paint of the invention, the viscosity at a liquid temperature of 25° C. is preferably 50 to 600 mPa·s, more preferably 60 to 550 mPa·s, and still more preferably 100 to 500 mPa·s. In the case where the viscosity of the conductive paint is 50 mPa·s or more, when the conductive paint is cured to make a shield layer, liquid dripping on the package wall surface can be prevented, and thus the shield layer can be evenly formed. At the same time, metal particles can be prevented from settling. In the case where the viscosity of the conductive paint is 600 mPa·s or less, when the conductive paint is sprayed, clogging of the spray nozzle is prevented, making it easier to form a shield layer evenly on the package surface and sidewall surface.

Incidentally, as used herein, "viscosity of a conductive paint" means the viscosity measured using a cone-and-plate rotational viscometer at a rotation speed of 10 rpm.

To the extent that the object of the invention is not impaired, the conductive paint of the invention may also contain known additives such as defoamers, thickeners, pressure-sensitive adhesives, fillers, flame retardants, and colorants.

Next, a method for producing a shield package using the conductive paint of the invention will be described. Incidentally, such a method for producing a shield package is also the method for producing a shield package of the invention.

An example of the method for producing a shield package of the invention shown below includes (1) a package formation step, (2) a package individualization step, (3) a conductive paint application step, (4) a shield layer formation step, and (5) a cutting step.

Incidentally, in the method for producing a shield package of the invention, (2) the package individualization step is not an essential step and may be omitted depending on the purpose.

Hereinafter, each step will be described with reference to the drawings.

(1) Package Formation Step

First, as shown in FIG. 1(a), a substrate 1, on which a plurality of electronic components 2 are mounted, and a ground circuit pattern 3 is provided between the plurality of electronic components 2, is prepared.

Next, as shown in FIG. 1(b), an encapsulant 4 is loaded onto the electronic components 2 and the ground circuit pattern 3 and cured to encapsulate the electronic components 2, thereby preparing packages 5.

The encapsulant is not particularly limited, and metals such as iron and aluminum, resins mixed with powders of such metals, resins such as epoxy resins, ceramics, and the like can be used.

(2) Package Individualization Step

Next, as shown in FIG. 2, the encapsulant 4 between the plurality of electronic components 2 is cut to form grooves 6. By the grooves 6, the packages 5 are individualized for each electronic component 2. At this time, at least part of the ground circuit pattern 3 is exposed on the wall surface forming each groove 6.

As a result of forming such grooves 6, the packages 5 can be easily singulated as described below. In addition, in the conductive paint application step described below, the conductive paint can also be applied to the side surface of each package 5.

(3) Conductive Paint Application Step

Next, as shown in FIG. 3, a conductive paint 7 is applied onto the substrate 1 having formed thereon the packages 5.

The method for applying a conductive paint is not particularly limited, and may be, for example, brushing or spraying with a spray gun or the like.

In the case of applying the conductive paint 7 by spraying, it is preferable to suitably set the spray conditions including the injection pressure, the injection flow rate, the distance from the injection port of the spray gun to the package 5 surface, and the like.

(4) Shield Layer Formation Step

Next, after the conductive paint 7 is dried, the substrate 1 having applied thereto the conductive paint 7 is heated to cure the conductive paint 7, thereby forming a shield layer 7a as shown in FIG. 4. In this step, the drying and curing of the conductive paint 7 may be performed at the same time or separately.

The heating temperature is not particularly limited, but is preferably 90 to 110° C. Because the conductive paint 7 is the conductive paint of the invention described above, the conductive paint 7 sufficiently cures even at such a low heating temperature.

(5) Cutting Step

As shown in FIG. 5, the substrate 1 is cut along the grooves 6 to singulate the packages 5. The method for cutting the substrate 1 is not particularly limited, and may be cutting with a dicing saw or the like.

Through the above steps, a shield package 8 in which the shield layer 7a is formed on the package 5 can be produced.

As described above, because the conductive paint of the invention cures at a relatively low curing temperature, damage to electronic components due to heat can be suppressed.

Next, a method for producing a resin molded article having a shield layer using the conductive paint of the invention will be described.

An example of the method for producing a resin molded article having a shield layer of the invention shown below includes (1) a conductive paint application step and (2) a shield layer formation step.

(1) Conductive Paint Application Step

Onto a resin molded article, the conductive paint according to the invention is applied. The method for applying a conductive paint is not particularly limited, and may be, for example, brushing or spraying with a spray gun or the like. In the case of applying the conductive paint by spraying, it is preferable to suitably set the spray conditions including the injection pressure, the injection flow rate, the distance from the injection port of the spray gun to the surface of the resin molded article, and the like.

(2) Shield Layer Formation Step

Next, the conductive paint is dried and then heated to cure the conductive paint, thereby forming a shield layer. In this step, the drying and curing of the conductive paint may be performed at the same time or separately.

EXAMPLES

Hereinafter, examples for describing the invention in further detail will be shown, but the invention is not limited to these examples. Incidentally, unless otherwise noted, the blending proportions and the like given below are based on mass.

The components were mixed according to the formulations shown below in Tables 1 and 2 to prepare conductive paints of Examples 1 to 7 and Comparative Examples 1 to 8. Each numerical value in Tables 1 and 2 means the number of parts by mass.

The details of the compounds listed in the tables are as follows.

- Binder component (A): Mixture of 40 parts by mass of a solid epoxy resin (trade name "JER157S70" manufactured by Mitsubishi Chemical Corporation), 30 parts by mass of a liquid glycidyl amine-based epoxy resin (trade name "EP-3905S" manufactured by ADEKA Corporation), and 30 parts by mass of a liquid glycidyl ether-based epoxy resin (trade name "EP-4400" manufactured by ADEKA Corporation)
- Metal particles (B): Mixture of a spherical silver-coated copper powder having an average particle size of 2 μm and a flaky silver-coated copper powder having an average particle size of 5 μm (average particle size: 5 μm, aspect ratio=5), the mixing ratio between the spherical silver-coated copper powder and the flaky silver-coated copper powder (spherical:flaky)=1:4
- Blocked isocyanate curing agent (C): Trade name "Coronate 2554" manufactured by Tosoh Corporation
- Isocyanate curing agent: Trade name "DN-992" manufactured by DIC Corporation
- Imidazole curing agent: Trade name "2-Undecyl imidazole" manufactured by Shikoku Chemicals Corporation
- Solvent (D): 1-Methoxy-2-propanol The curability, conductivity (sheet resistance), shieldability (electrolytic shielding effect), storage stability (rate of change in viscosity), adhesion (cross-cut test), and application stability of each obtained conductive paint were measured and evaluated. The results are shown in Tables 1 and 2. The measurement and evaluation methods are as shown below.

(Curability 1)

Each of the conductive paints according to the examples and comparative examples was applied to a glass plate to a thickness of 20 μm and heated at 100° C. for 60 minutes to cure the conductive paint. The curability of the conductive paint was evaluated based on the following evaluation criteria.

Excellent: Upon wiping the conductive paint cured product with a waste cloth, when the conductive paint did not adhere to the waste cloth, such a product was judged to be fully cured.

Poor: Upon wiping the conductive paint cured product with a waste cloth, when the conductive paint adhered to the waste cloth, such a product was judged to be uncured or semi-cured.

(Curability 2: Evaluation of Acetone Rubbing Properties)

Onto a glass epoxy substrate, a 70-μm-thick polyimide film having a 5-mm-wide slit was attached to make a printing plate. Each of the conductive paints according to the examples and comparative examples was line-printed on the polyimide film (60 mm long, 5 mm wide, about 50 μm thick) and heated at 100° C. for 60 minutes to completely cure the conductive paint. Subsequently, the polyimide film was peeled off to give a cured product sample. On the cured product sample, an acetone-soaked paper towel was moved back and forth ten times. Then, in such a cured product sample, the peeling rate (%) of the conductive paint cured product was measured by the following formula (1). In this evaluation, a lower peeling rate of the conductive paint cured product indicates better curing of the conductive paint. When the peeling rate was 20% or less, the curability was rated as excellent.

$$\text{Conductive paint peeling rate (\%)} = (1 - ([\text{area of the cured product sample remaining after the paper towel treatment}]/[\text{area of the cured product sample before the paper towel treatment}])) \times 100 \quad (1)$$

(Conductivity)

Each of the conductive paints according to the examples and comparative examples was applied to a 150 mm×150 mm square PP (polypropylene) sheet to a thickness of 20 μm and heated at 100° C. for 60 minutes to give a conductive paint cured product. The conductivity of the obtained cured product was evaluated using a surface resistance measuring jig (milliohm high tester). When the sheet resistance value was 30 mΩ or less, the conductivity was rated as excellent.

(Shieldability)

Using the cured products prepared for the evaluation of conductivity, the electric field shielding effect per GHz was measured by the KEC method. When the electric field shielding effect was 70 dB or more, such a product was rated as having an excellent shielding effect.

(Storage Stability)

First, the viscosity of each of the conductive paints according to the examples and comparative examples immediately after production was measured using a BH-type viscometer rotor No. 7 (10 rpm). The measured viscosity was taken as the initial viscosity ($V_0$). Next, the viscosity of each of the conductive paints according to the examples and comparative examples after being allowed to stand at an ambient temperature for 7 days from production was measured using a BH-type viscometer rotor No. 7 (10 rpm). The measured viscosity was taken as the viscosity after being allowed to stand for 7 days ($V_7$). The rate of change in viscosity (%) was calculated by the following formula (2), and the storage stability of the conductive paint was evaluated. When the rate of change (%) was −20% to 20%, the storage stability was rated as excellent. Incidentally, curing occurred in Comparative Example 7, while gelling occurred in Comparative Example 8, and thus it was not possible to measure the viscosity of the conductive paint.

The evaluation criteria are as follows. The results are shown in Table 1.

$$\text{Rate of change} = \{(V_7 - V_0)/V_0\} \times 100 \quad (2)$$

(Adhesion)

The adhesion between a shield layer and a package surface or a ground circuit was evaluated based on JIS K 5600-5-6: 1999 (cross-cut method). Specifically, a copper-clad laminate was prepared for the evaluation of adhesion to a ground circuit, and a mold resin was prepared for the evaluation of adhesion to a package surface. Each was masked with a polyimide tape to form an opening 5 cm wide and 10 cm long, and the conductive paints according to the examples and comparative examples were each spray-applied as a conductive resin composition using the application apparatus schematically shown in FIG. 6(a) (Spray Cart III manufactured by Spraying Systems Co., spray nozzle: YB1/8MVAU-SS+SUMV91-SS). Then, heating was performed at 100° C. for 60 minutes to cure the conductive resin composition, and the polyimide tape was peeled off, thereby forming a coating film having a thickness of about 20 μm.

A cross-cut test was performed on the copper foil and the mold resin, each having formed thereon the coating film.

The adhesion was evaluated based on the following criteria.

Excellent: The cut edges were completely smooth, and there was no peeling in any grid square.

Poor: The coating film exhibited some peeling.

(Application Stability)

FIGS. 6(a) to 6(c) are schematic diagrams showing the method for evaluating application stability. Each of the conductive paints according to the examples and comparative examples was spray-applied to the square glass epoxy substrate (10 cm long×10 cm wide×1 mm thick) shown in FIG. 6(b) using the application apparatus schematically shown in FIG. 6(a) (Spray Cart III manufactured by Spraying Systems Co., spray nozzle: YB1/8MVAU-SS+SUMV91-SS) in the following manner, and the application stability of the conductive paint was evaluated.

In FIG. 6(a), reference numeral 25 indicates a tank (paint container), reference numeral 26 indicates a tube, reference numeral 27 indicates a nozzle, reference numeral 28 indicates a rotary table, reference numeral 29 indicates a stirring apparatus, reference numeral 30 indicates a gas introduction tube, and reference numeral 31 indicates a glass epoxy substrate. The tank 25 is an almost cylindrical container having a volume of 3 L. The tank 25 is equipped with a stirring apparatus 29 having a stirring blade, and is configured such that a gas such as nitrogen is introduced from the gas introduction tube 30 to pressurize the inside. The tube 26 has a length of 3 m and an inner diameter of 4 mm, and connects the tank 25 and the nozzle 27 to each other. The tube 26 has slack (26a) in part, and the slack portion has a height difference (t in FIG. 6(a)) of 3 cm. The nozzle 27 has a length of 78 mm and an injection port diameter of 0.5 mm. The distance from the upper surface of the rotary table 28 to the tip of the nozzle 27 is 8 cm.

On the glass epoxy substrate 31, as shown in FIG. 6(b), four pieces of polyimide tapes 32 to 35 were attached near the respective corners of the glass epoxy substrate 31, and a polyimide tape 36 was attached to the central part of the glass epoxy substrate 31. The area of each polyimide tape 32 to 36 is 1 cm×1 cm (dimensions a and b in FIG. 6(b) are both 1 cm), and the polyimide tapes 32 to 35 are attached 1 cm inside from each side of the glass epoxy substrate 31 (dimensions c and d in FIG. 6(b) are both 1 cm) in such a manner that the sides of each tape are parallel to the sides of the substrate.

This glass epoxy substrate 31 was disposed on the central part of the upper surface of the rotary table 28. The horizontal distance from the tip of the nozzle 27 to the glass epoxy substrate 31 (s in FIG. 6(a)) was set at 25 cm. Next, 2 kg of the conductive paint was fed to the tank 25, and, immediately after that, while rotating the rotary table 28 at 160 rpm, spray application was performed under the following spray conditions, followed by heating at 100° C. for 60 minutes, thereby forming a conductive paint cured product having a thickness of 20 μm.

Further, after 20 minutes after the feeding of the conductive paint to the tank 25 has elapsed, spray application and heating were performed under the same conditions as above, thereby forming a conductive paint cured product with a thickness of about 20 μm.

Hereinafter, the conductive paint cured product formed immediately after the feeding of the conductive paint to the tank 25 is referred to as "cured product A", while the conductive paint cured product formed 20 minutes after the feeding of the conductive paint to the tank 25 is referred to as "cured product B".

<Spray Conditions>

Fluid pressure: 0.1 MPa, pattern air: 0.07 MPa

Room temperature: 25° C., humidity: 60%

Application time and the number of applications: application time: 8 seconds, the number of applications: four back-and-forth strokes After the completion of heating, the substrate was allowed to stand for 30 minutes at room temperature, and then the polyimide tapes 32 to 36 were each peeled off. As shown in FIG. 6(c), the thickness of the portion of the glass epoxy substrate 31 where the tape was peeled off (arrow X) and the thickness of the portion adjacent to the peel-off portion, where the glass epoxy substrate 31 had formed thereon a conductive paint cured product 41, (arrow Y) were each measured with a micrometer, and the former was subtracted from the latter. In this manner, the thickness of the conductive paint cured product was determined at five points.

The application stability was evaluated from the thickness of the cured product A and the thickness of the cured product B. The evaluation criteria are as follows.

Excellent: The thickness of the cured product A at all five points and the thickness of the cured product B at all five points were within a range of 20 μm±5 μm.

Poor: The cured product A and/or cured product B had formed a thickness not within a range of 20 μm±5 μm at one or more points.

TABLE 1

| | | Example 1 | Example 2 | Example 3 | Example 4 | Example 5 | Example 6 | Example 7 |
|---|---|---|---|---|---|---|---|---|
| Composition | Binder component (A) | 100 | 100 | 100 | 100 | 100 | 100 | 100 |
| | Metal particles (B) | 3000 | 1000 | 4000 | 3000 | 3000 | 3000 | 3000 |
| | Blocked isocyanate curing agent (C) | 100 | 100 | 100 | 50 | 150 | 100 | 100 |
| | Solvent (D) | 1000 | 1000 | 1000 | 1000 | 1000 | 200 | 1500 |
| Evaluation | Curability 1 | Excellent | Excellent | Excellent | Excellent | Excellent | Excellent | Excellent |
| | Curability 2 | 0% | 0% | 6% | 14% | 0% | 0% | 0% |
| | Conductivity [Ω/sq] | 23.9 | 29.8 | 15.6 | 17.4 | 20.7 | 13.4 | 29.0 |
| | Shieldability [dB] | 75 | 72.7 | 78.2 | 77.5 | 76.2 | 79 | 73.1 |
| | Storage stability | −4% | −5% | −5% | 1% | 12% | 10% | −16% |
| | Adhesion | Excellent | Excellent | Excellent | Excellent | Excellent | Excellent | Excellent |
| | Application stability | Excellent | Excellent | Excellent | Excellent | Excellent | Excellent | Excellent |

TABLE 2

| | | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|
| Composition | Binder component (A) | 100 | 100 | 100 | 100 | 100 | 100 | 100 | 100 |
| | Metal particles (B) | 500 | 5000 | 3000 | 3000 | 3000 | 3000 | 3000 | 3000 |
| | Blocked isocyanate curing agent (C) | 100 | 100 | 30 | 200 | 100 | 100 | — | — |
| | Isocyanate curing agent | — | — | — | — | — | — | 100 | — |
| | Imidazole curing agent | — | — | — | — | — | — | — | 100 |
| | Solvent (D) | 1000 | 1000 | 1000 | 1000 | 100 | 1800 | 1000 | 1000 |
| Evaluation | Curability 1 | Excellent | Excellent | Poor | Excellent | Excellent | Poor | Excellent | Excellent |
| | Curability 2 | 0% | 92% | 100% | 0% | 0% | 60% | 5% | 15% |
| | Conductivity [Ω/sq] | 87.8 | 22.4 | 46.3 | 78.0 | 28.3 | 31.7 | 40.0 | 73.2 |
| | Shieldability [dB] | 50.6 | 75.6 | 66.3 | 54.4 | 73.3 | 72 | 68.9 | 56.2 |
| | Storage stability | −5% | −9% | 3% | 15% | 3% | −15% | Unmeasurable | Gelled |
| | Adhesion | Excellent | Poor | Poor | Excellent | Excellent | Poor | Excellent | Excellent |
| | Application stability | Excellent | Poor | Poor | Excellent | Poor | Poor | Excellent | Excellent |

As shown in Tables 1 and 2, the conductive paints according to Examples 1 to 7 were excellent in curability, conductivity, shieldability, storage stability, adhesion, and application stability.

Comparative Example 1 is an example in which the content of the metal particles (B) is less than 1,000 parts by mass per 100 parts by mass of the binder component (A). The conductivity and shieldability were inferior.

Comparative Example 2 is an example in which the content of the metal particles (B) is more than 4,000 parts by mass per 100 parts by mass of the binder component (A). The curability 2, adhesion, and application stability were inferior.

Comparative Example 3 is an example in which the content of the blocked isocyanate curing agent (C) is less than 50 parts by mass relative to the binder component (A). The curabilities 1 and 2, conductivity, shieldability, adhesion, and application stability were inferior. Here, the reason why the conductivity and shieldability were inferior is presumably that the curing of the conductive paint at a low temperature (110° C. or less) was insufficient.

Comparative Example 4 is an example in which the content of the blocked isocyanate curing agent (C) is more than 150 parts by mass relative to the binder component (A). The conductivity and shieldability were inferior. This is presumably because due to an increase in the content of the curing agent (C), the content ratio of the metal particles (B) in the conductive paint relatively decreased.

Comparative Example 5 is an example in which the content of the solvent (D) is less than 200 parts by mass per 100 parts by mass of the binder component (A). The viscosity of the conductive paint was high. The application stability was inferior.

Comparative Example 6 is an example in which the content of the solvent (D) is more than 1,500 parts by mass per 100 parts by mass of the binder component (A). The curability, conductivity, adhesion, and application stability were inferior.

Comparative Examples 7 and 8 are each an example in which the curing agent was a curing agent other than a blocked isocyanate curing agent. The conductivity, shieldability, and storage stability were inferior. Here, the reason why the conductivity and shieldability were inferior is presumably that due to use of curing agents other than a blocked isocyanate curing agent, the curing of the conductive paint at a low temperature (110° C. or less) was insufficient.

REFERENCE SIGNS LIST

1: Substrate
2: Electronic component
3: Ground circuit pattern
4: Encapsulant
5: Package
6: Groove
7: Conductive paint
7a: Shield layer
8: Shield package
25: Tank
26: Tube
27: Nozzle
28: Rotary table
29: Stirring apparatus
30: Gas introduction tube
31: Glass epoxy substrate
32 to 36: Polyimide tape
41: Conductive paint cured product

The invention claimed is:

1. A conductive paint comprising, per 100 parts by mass of a binder component (A) containing 5 to 80 mass % of an epoxy resin that is solid at ordinary temperatures and 20 to 95 mass % of an epoxy resin that is liquid at ordinary temperatures:
 1,000 to 4,000 parts by mass of metal particles (B);
 50 to 150 parts by mass of a blocked isocyanate curing agent (C) which is protected with a protecting group that is removed at a temperature of 90 to 110° C. such that the conductive paint is curable at the temperature of 90 to 110° C.; and
 200 to 1,500 parts by mass of a solvent (D).

2. The conductive paint according to claim 1, wherein the metal particles (B) are at least one kind selected from the group consisting of a silver powder, a silver-coated copper powder, and a silver-coated copper alloy powder.

3. The conductive paint according to claim 2, used for a shield package.

4. A method for producing a shield package including a package covered with a shield layer, the package including an electronic component mounted on a substrate and encapsulated with an encapsulant, the method for producing a shield package comprising:
- a package formation step of mounting a plurality of electronic components on a substrate, and loading an encapsulant onto the substrate followed by curing to encapsulate the electronic components, thereby preparing packages;
- a conductive paint application step of applying the conductive paint according to claim 2 onto the substrate having formed thereon the packages;
- a shield layer formation step of heating the substrate having applied thereto the conductive paint to cure the conductive paint, thereby forming a shield layer; and
- a cutting step of cutting the substrate to singulate the packages.

5. The method for producing a shield package according to claim 4, wherein the heating in the shield layer formation step is performed at a temperature of 90 to 110° C.

6. A method for producing a shield package including a package covered with a shield layer, the package including an electronic component mounted on a substrate and encapsulated with an encapsulant, the method for producing a shield package comprising:
- a package formation step of mounting a plurality of electronic components on a substrate, and loading an encapsulant onto the substrate followed by curing to encapsulate the electronic components, thereby preparing packages;
- a package individualization step of, after the package formation step, cutting the encapsulant between the plurality of electronic components to form grooves, thereby individualizing the packages on the substrate by the grooves;
- a conductive paint application step of applying the conductive paint according to claim 2 onto the substrate having formed thereon the packages;
- a shield layer formation step of heating the substrate having applied thereto the conductive paint to cure the conductive paint, thereby forming a shield layer; and
- a cutting step of cutting the substrate along the grooves to singulate the packages.

7. The method for producing a shield package according to claim 6, wherein the heating in the shield layer formation step is performed at a temperature of 90 to 110° C.

8. A method for producing a resin molded article having a shield layer, comprising:
- a conductive paint application step of applying the conductive paint according to claim 2 to a resin molded article; and
- a shield layer formation step of heating the resin molded article having applied thereto the paint at a temperature of 90 to 110° C. to cure the paint, thereby forming a shield layer.

9. The conductive paint according to claim 1, used for a shield package.

10. A method for producing a shield package including a package covered with a shield layer, the package including an electronic component mounted on a substrate and encapsulated with an encapsulant, the method for producing a shield package comprising:
- a package formation step of mounting a plurality of electronic components on a substrate, and loading an encapsulant onto the substrate followed by curing to encapsulate the electronic components, thereby preparing packages;
- a conductive paint application step of applying the conductive paint according to claim 9 onto the substrate having formed thereon the packages;
- a shield layer formation step of heating the substrate having applied thereto the conductive paint to cure the conductive paint, thereby forming a shield layer; and
- a cutting step of cutting the substrate to singulate the packages.

11. The method for producing a shield package according to claim 10, wherein the heating in the shield layer formation step is performed at a temperature of 90 to 110° C.

12. A method for producing a shield package including a package covered with a shield layer, the package including an electronic component mounted on a substrate and encapsulated with an encapsulant, the method for producing a shield package comprising:
- a package formation step of mounting a plurality of electronic components on a substrate, and loading an encapsulant onto the substrate followed by curing to encapsulate the electronic components, thereby preparing packages;
- a package individualization step of, after the package formation step, cutting the encapsulant between the plurality of electronic components to form grooves, thereby individualizing the packages on the substrate by the grooves;
- a conductive paint application step of applying the conductive paint according to claim 9 onto the substrate having formed thereon the packages;
- a shield layer formation step of heating the substrate having applied thereto the conductive paint to cure the conductive paint, thereby forming a shield layer; and
- a cutting step of cutting the substrate along the grooves to singulate the packages.

13. The method for producing a shield package according to claim 12, wherein the heating in the shield layer formation step is performed at a temperature of 90 to 110° C.

14. A method for producing a resin molded article having a shield layer, comprising:
- a conductive paint application step of applying the conductive paint according to claim 9 to a resin molded article; and
- a shield layer formation step of heating the resin molded article having applied thereto the paint at a temperature of 90 to 110° C. to cure the paint, thereby forming a shield layer.

15. A method for producing a shield package including a package covered with a shield layer, the package including an electronic component mounted on a substrate and encapsulated with an encapsulant, the method for producing a shield package comprising:
- a package formation step of mounting a plurality of electronic components on a substrate, and loading an encapsulant onto the substrate followed by curing to encapsulate the electronic components, thereby preparing packages;

a conductive paint application step of applying the conductive paint according to claim 1 onto the substrate having formed thereon the packages;

a shield layer formation step of heating the substrate having applied thereto the conductive paint to cure the conductive paint, thereby forming a shield layer; and a cutting step of cutting the substrate to singulate the packages.

16. The method for producing a shield package according to claim 15, wherein the heating in the shield layer formation step is performed at a temperature of 90 to 110° C.

17. A method for producing a shield package including a package covered with a shield layer, the package including an electronic component mounted on a substrate and encapsulated with an encapsulant, the method for producing a shield package comprising:

a package formation step of mounting a plurality of electronic components on a substrate, and loading an encapsulant onto the substrate followed by curing to encapsulate the electronic components, thereby preparing packages;

a package individualization step of, after the package formation step, cutting the encapsulant between the plurality of electronic components to form grooves, thereby individualizing the packages on the substrate by the grooves;

a conductive paint application step of applying the conductive paint according to claim 1 onto the substrate having formed thereon the packages;

a shield layer formation step of heating the substrate having applied thereto the conductive paint to cure the conductive paint, thereby forming a shield layer; and a cutting step of cutting the substrate along the grooves to singulate the packages.

18. The method for producing a shield package according to claim 17, wherein the heating in the shield layer formation step is performed at a temperature of 90 to 110° C.

19. A method for producing a resin molded article having a shield layer, comprising:

a conductive paint application step of applying the conductive paint according to claim 1 to a resin molded article; and a shield layer formation step of heating the resin molded article having applied thereto the paint at a temperature of 90 to 110° C. to cure the paint, thereby forming a shield layer.

20. The conductive paint according to claim 1, wherein the blocked isocyanate curing agent (C) is selected from the group consisting of secondary or tertiary alcohols, CH-acid compounds, oximes, lactams, phenols, N-alkylamides, imides, and secondary amines.

\* \* \* \* \*